United States Patent
Kojima et al.

[11] Patent Number: 5,950,085
[45] Date of Patent: Sep. 7, 1999

[54] METHOD OF MANUFACTURING ELECTRICALLY ERASABLE SEMICONDUCTOR NON-VOLATILE MEMORY DEVICE

[75] Inventors: Yoshikazu Kojima; Tetsuya Maeda, both of Chiba, Japan

[73] Assignee: Seiko Instruments Inc., Japan

[21] Appl. No.: 08/620,929

[22] Filed: Mar. 22, 1996

[30]   Foreign Application Priority Data

| Mar. 24, 1995 | [JP] | Japan | 7-066405 |
| May 12, 1995 | [JP] | Japan | 7-114895 |
| Aug. 3, 1995 | [JP] | Japan | 7-198804 |
| Jun. 21, 1996 | [JP] | Japan | 8-064964 |

[51] Int. Cl.$^6$ ............................................. H01L 21/336
[52] U.S. Cl. .................................... 438/257; 438/263
[58] Field of Search ................................ 438/257, 258, 438/263, 264

[56]   References Cited

U.S. PATENT DOCUMENTS

| 4,376,947 | 3/1983 | Chiu et al. | 438/257 |
| 4,831,270 | 5/1989 | Weisenberger | 250/492.2 |
| 5,273,923 | 12/1993 | Chang et al. | 438/264 |
| 5,316,961 | 5/1994 | Okazawa | 438/257 |
| 5,453,393 | 9/1995 | Bergemont | 438/258 |
| 5,656,513 | 8/1997 | Wang et al. | 438/263 |

*Primary Examiner*—John F. Niebling
*Assistant Examiner*—Michael S. Lebentritt
*Attorney, Agent, or Firm*—Adams & Wilks

[57]   ABSTRACT

A method of manufacturing an electrically erasable semiconductor non-volatile memory device comprises forming a field insulating film on a surface of a semiconductor substrate having a first conductivity type. A gate insulating film is formed on the surface of the semiconductor substrate. Source and drain regions having a second conductivity type are formed in the surface of the semiconductor substrate in spaced-apart relationship with each other by introducing impurity ions having the second conductivity type into the semiconductor substrate with an acceleration energy sufficient to form a peak value of impurity concentration at a depth of more than approximately 500 Å from the surface of the semiconductor substrate. The gate insulating film is then etched on the drain region to form a tunnel region having opposite sides connected to the field insulating film. Thereafter, a tunnel insulating film is formed on the tunnel region and a floating gate electrode is formed over the source region, the drain region and the semiconductor substrate through the gate insulating film and the tunnel insulating film. A control insulating film is then formed on the floating gate electrode, and a control gate electrode is formed over the floating gate electrode through the control insulating film.

10 Claims, 12 Drawing Sheets

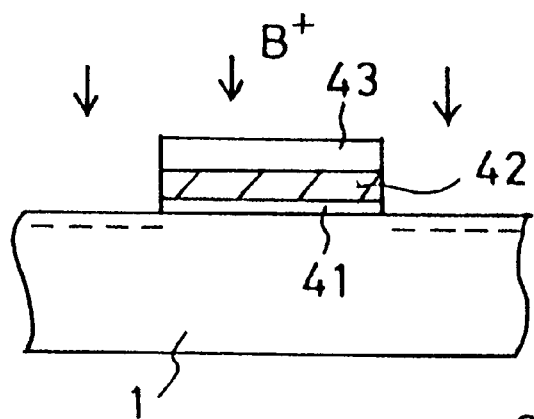
F I G. 7 A
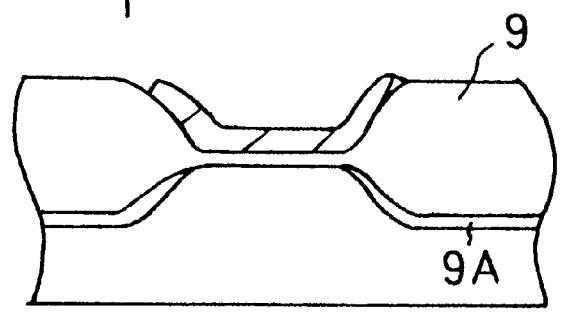
F I G. 7 B
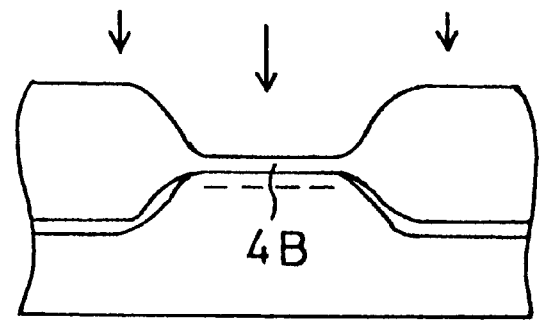
F I G. 7 C
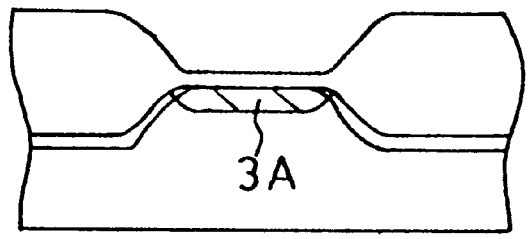
F I G. 7 D F I G. 1 0 F
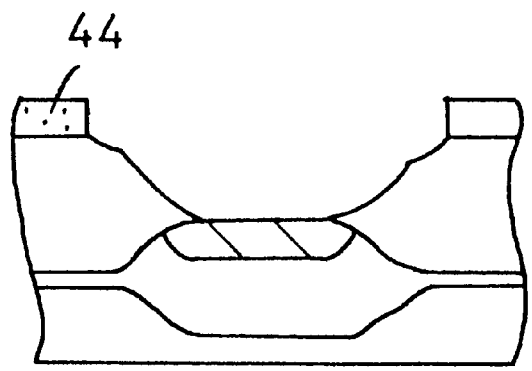
F I G. 1 0 G
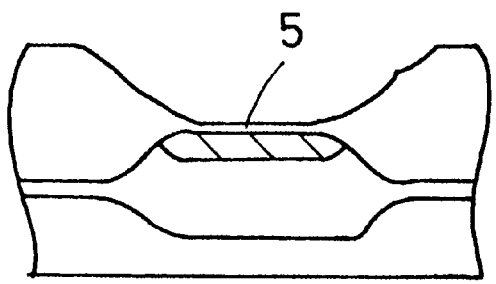
F I G. 1 0 H
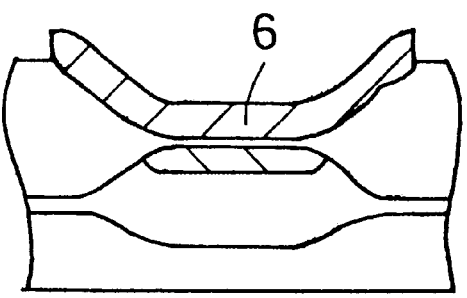

METHOD OF MANUFACTURING ELECTRICALLY ERASABLE SEMICONDUCTOR NON-VOLATILE MEMORY DEVICE

BACKGROUND OF THE INVENTION

The present invention relates to an electric erasable semiconductor non-volatile memory device and a method of manufacturing the same.

In FIGS. 2A and 2B, there is shown the general structure of an electric erasable semiconductor non-volatile memory cell (hereinafter referred to as the "EEPROM cell") wherein FIG. 2A is a plan view of the memory cell and FIG. 2B is a sectional view taken along C—C line of FIG. 2A. As shown, a N-type source region 2 and a N-type drain region 3 are provided over the surface of a P-type silicon substrate 1 through a channel forming region 4A.

On the N-type drain region 3 there is formed a silicon oxide film 5 thereby forming a tunnel region 5A. Further, on the channel forming region 4A there is formed a floating gate electrode 6 through a gate insulating film 24 so as to partly overlap the source region 2 and the drain region 3. The floating gate electrode is strongly capacity-coupled to a control gate electrode 8 provided through a control insulating film 7.

The conductance of the channel forming region 4A between the source region 2 and the drain region 3 changes depending on the potential of the floating gate electrode 6. Therefore, by changing the amount of electrical charge in the floating gate electrode, it is possible to store information as a non-volatile one. In order to change the amount of charge in the floating gate electrode, a tunnel insulating film 5 is partially formed between the drain region and the floating gate electrode thereby forming a tunnel region. When the portion of the drain region serving as the tunnel region is applied with a high voltage of about 15V with respect to the control gate electrode, the electrons in the floating gate electrode flow into the drain region through the tunnel insulating film so that the amount of electrical charge in the floating gate electrode changes.

A memory array is provided by arranging The EEPROM cells shown in FIGS. 2A in both X- and Y- directions in the form of a matrix. Each of the EEPROM cells allows non-volatile information to be programmed by generating a high voltage of about 15V through a boosting circuit provided in an IC. Accordingly, the EEPROM IC can perform reading and programming operations by a single power source of 5V, for example.

However, the EEPROM cell to be used for the conventional single power source EEPROM IC has had a tunnel region 5A inside its drain region as shown in FIG. 2A in order to reduce the magnitude of current flowing through the drain region at the time of programming. That is, the tunnel region has been spaced apart from a field insulating film 9A.

Therefore, it has been difficult to manufacture a compact and high-density single power source EEPROM IC. since the memory cell for forming one bit has required a large area.

Accordingly, an object of the present invention is to provide a compact and high-density EEPROM IC at low cost in such a manner that each one bit memory cell is reduced by narrowing the channel forming width.

SUMMARY OF THE INVENTION

In order to achieve the above object, the present invention makes use of the following structure:

(1) an electrical erasable semiconductor non-volatile memory cell comprising second conductive type source and drain regions provided on the surface of a first conductive type semiconductor region in spaced apart relationship with each other, a channel forming region which is the surface of the semiconductor region between the source region and the above-mentioned drain region, a floating gate electrode provided on the channel forming region through a gate insulating film and a control gate electrode capacity-coupled to the floating gate electrode through a control insulating film, wherein a tunnel insulating film is provided between the drain region and the floating gate electrode and the peak position of the impurity atom concentration profile at the drain region is present at a depth equal to more than about 500 Å from the tunnel insulating film.

(2) An electrical erasable semiconductor non-volatile memory cell described in the preceding paragraph 2, wherein the tunnel insulating film provided on the drain region is formed wider than the width of the channel forming region.

(3) A method of manufacturing an electrical erasable semiconductor non-volatile memory cell comprising the steps of: forming a gate insulating film on the surface of a first conductive type semiconductor region; forming second conductive type source and drain regions formed on the surface of the semiconductor region in spaced apart relationship with each other; patterning a tunnel region by etching the gate insulating film on the drain region; forming a tunnel insulating film on the tunnel; patterning a floating gate electrode on the source and drain regions and the semiconductor region through the gate insulating film and the tunnel insulating film; forming a control insulating film on the floating gate electrode; and patterning a control gate electrode on the floating gate electrode through the control insulating film, wherein the step of forming the drain region includes ion-implantation with accelerating energy capable of causing the peak position of impurity atom concentration distribution to lie at a depth of about 500 Å from the surface of the semiconductor region.

(4) An electric erasable semiconductor non-volatile memory cell comprising: second conductive type source and drain regions formed on the surface of a first conductive type semiconductor region in spaced apart relationship with each other; a channel forming region as the surface of the semiconductor region between the source region and the drain region; a floating gate electrode provided on the source and drain regions and the channel forming region through a gate insulating film; a control gate electrode capacity-coupled to the floating gate electrode through a control insulating film; and a tunnel insulating film provided between the drain region and the floating gate electrode, wherein the drain region comprises a high-density first drain region and a low-density second drain region provided around the first drain region.

(5) An electric erasable semiconductor non-volatile memory cell as described in Paragraph (4) wherein the first drain region is formed of an arsenic impurity region and the second drain region is formed of a self-alignment phosphorus impurity region around the first drain region.

(6) A method of manufacturing an electric erasable semiconductor non-volatile memory integrated circuit device, which comprises the steps of: forming partially a field insulting film on the surface of a first conductive type semiconductor region to thereby provide an isolated region; forming a second conductive type source region and a first conductive type drain region in spaced apart relationship with each other on the surface of a transistor region which is apart of the semiconductor region excluding the isolated region; forming a gate insulating film on the surface of the transistor region; patterning a tunnel region by removing by etching a part of the gate insulating film on the first drain region; forming a second drain region by doping into the first drain region a second conductive type impurity from the tunnel region by ion-implantation; thermally treating the entire surface of the semiconductor region so that the second drain region diffuse from the first drain region to overlap the isolated region; forming a tunnel insulating film on the tunnel region; and patterning a floating gate electrode through the gate insulating film and the tunnel insulating film so as to make it partly overlap the source region and the first and second drain regions.

(7) An electric erasable semiconductor non-volatile memory integrated circuit device comprising a plurality of electric erasable semiconductor non-volatile memory cells each comprising: second conductive type source and drain regions formed on the surface of a first conductive type semiconductor region in spaced apart relationship with each other; a channel forming region as a part of the surface of the semiconductor region between the source region and the drain region; a floating gate electrode provided on the source region, the drain region and the channel forming region through a gate insulating film; a control gate electrode capacity-coupled to the floating gate electrode through a control insulating film; and a tunnel insulating film provided between the drain region and the floating gate electrode, wherein the above-mentioned isolated region is formed of a first conductive type inversion preventive impurity region and a field insulating film provided on the inversion preventive impurity region, and the inversion preventive impurity region extending from the end of the isolated region up to the channel forming region is deeply formed continuously with respect to the surface of the semiconductor region.

(8) A method of manufacturing an electric erasable semiconductor non-volatile memory integrated circuit, which comprises the steps of: forming a field insulating film on apart of the surface of a first conductive type semiconductor region; introducing a first conductive type impurity element into the surface of the semiconductor region through the field insulating film by means of ion-implantation; forming semiconductive type source and drain regions on a transistor region which is a part of the semiconductor region devoid of the field insulating film; forming a gate insulating film on the surface of the transistor region; patterning a tunnel region by removing by etching a part of the gate insulating film on the drain region; forming a tunnel insulating film on the surface of the tunnel region; and patterning a floating gate electrode on the source and drain regions and the tunnel region through the gate insulating film and the tunnel insulating film.

By setting the peak position of the impurity atom concentration profile at a depth of about more than 500 Å from the surface of the drain region, the surface impurity concentration of the tunnel region becomes low while the impurity concentration therearound becomes high. Accordingly, the impurity concentration of the portion of the drain region intersecting the field dope region becomes high to thereby preventing depletion. The surface concentration at the central portion of the drain region is made low so that the quality of the tunnel insulating film formed on the tunnel region can be improved.

As the drain region is made to have a double-diffusion structure, the low concentration drain region sufficiently diffuses down to a portion below the field insulating film on the separate region. Accordingly, the inversion voltage of the low concentration drain region under the field insulating film can be increased. When a high voltage is impressed upon the drain region, the portion around the drain region has a high-inversion voltage structure so that no depletion takes place and the voltage impressed upon the drain region can be effectively impressed upon the tunnel insulating film.

By forming the inversion-preventive field dope region on the surface of the semiconductor region under the field insulating film by ion-implantation after the formation of the field insulating film, the surface concentration of the field dope at the end of field isolation region is reduced so that the lowering of the N-type impurity concentration at the portion of the tunnel region overlapping the drain region and the field isolation region is prevented to thereby prevent the depletion of the tunnel region.

BRIEF DESCRIPTION OF THE DRAWINGS

FIGS. 1A to 1C show an electric erasable semiconductor non-volatile memory cell according to the present invention, wherein FIG. 1A is a plan view of the memory cell, FIG. 1B is a sectional view taken along 1B—1B line of FIG. 1A and FIG. 1C is a sectional view taken along 1C—1C line of FIG. 1A;

FIGS. 2A and 2B show a conventional electric erasable semiconductor non-volatile memory cell, wherein FIG. 2A is a plan view of the memory cell and FIG. 2B is a sectional view taken along 2A—2A line of FIG. 2A;

FIGS. 5A to 5C show an electric erasable semiconductor non-volatile memory cell according to the present invention wherein FIG. 5A is a plan view of the memory cell, FIG. 5B is a sectional view taken along 5B—5B line of FIG. 5A and FIG. 5C is a sectional view taken along B—B' line of FIG. 5A;

FIGS. 7A to 7I illustrate a series of steps to be taken for manufacturing the electric erasable semiconductor non-volatile memory cell of FIGS. 5A to 5C with each manufacturing step being shown in section;

FIGS. 8A to 8C show an electric erasable semiconductor non-volatile memory cell according to the present invention, wherein FIG. 8A is a plan view of the memory. FIG. 8B is a sectional view taken along 8B—8B line of FIG. 8A and FIG. 8C is a sectional view taken along 8C—8C line of FIG. 8A;

FIGS. 10A to 10H illustrate a series of steps to be taken for manufacturing the memory cell shown in FIGS. 8A to 8C with each of the manufacturing stages being shown in section.

DETAILED DESCRIPTION OF THE PREFERRED EMBODIMENTS

One embodiment of the present device will be described with reference to the accompanying drawings.

Figure 1A:
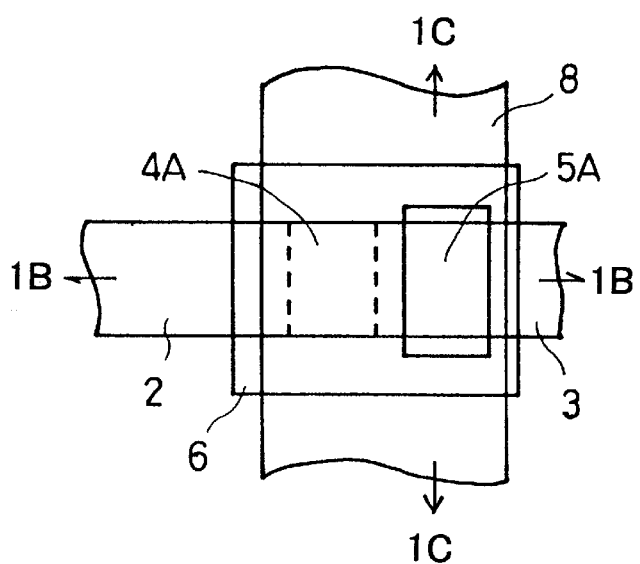
Figure 1C:
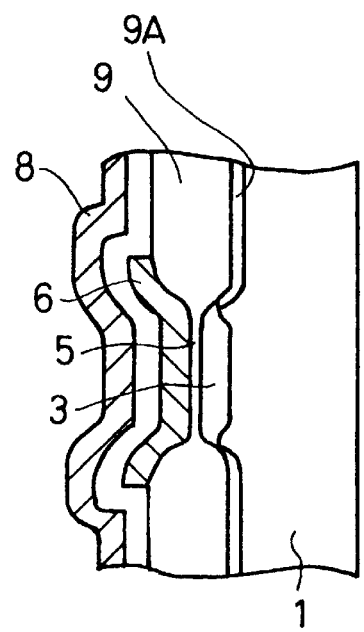
Figure 1B:
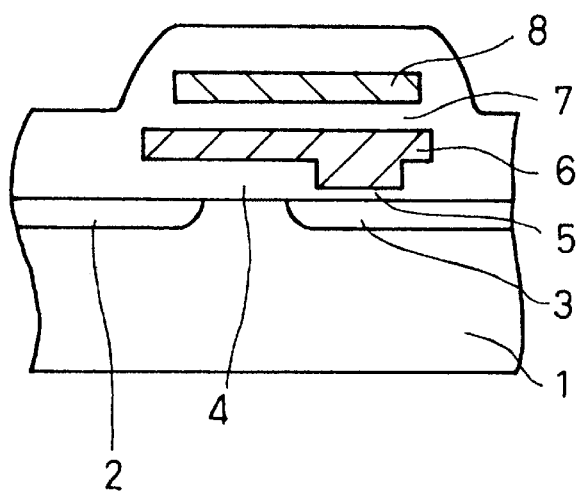
Figure 2A:
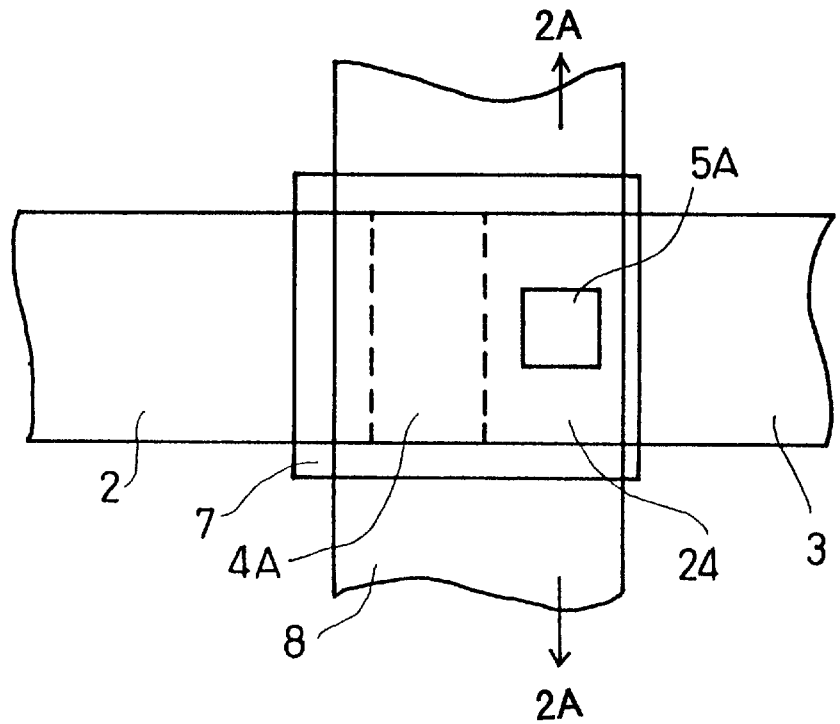
Figure 2B:
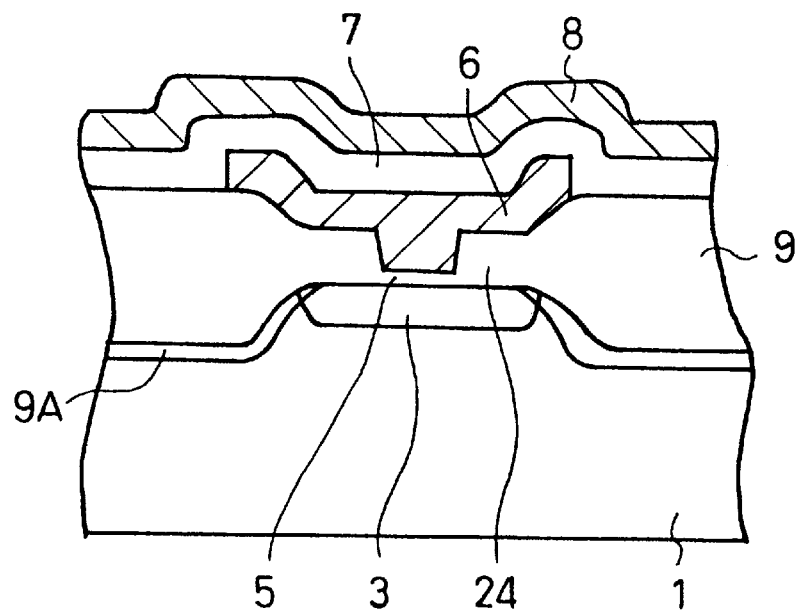

FIGS. 1A to 1C show a EEPROM cell according to the present invention. FIG. 1A is a plan view of the EEPROM cell, FIG. 1B is a sectional view taken along 1B—1B line of FIG. 1A and FIG. 1C is a sectional view taken along 1C—1C line of FIG. 1A.

On the surface of a P-type silicon substrate 1 there are formed a N-type source region 2 and a drain region 3 in spaced apart relationship with each other. On a channel forming region 4A as a silicon substrate surface between the source region and the drain region there is provided a floating gate electrode 6 through a gate insulating film 4. Further, on the floating gate electrode 6 there is provided a control gate electrode 8 which is strongly capacity-coupled to the floating gate electrode through a control insulating film 7.

Between the drain region 3 and the floating gate electrode 6 there is provided a partial tunnel insulating film 5. The tunnel region where the tunnel insulating film 5 is provided extends to a region where the drain region intersects an isolated region (formed of a field insulating film 9 and a field dope region 9A and electrically isolating memory cells from each other) as shown in FIG. 1A.

The method of reading and writing the EEPROM is the same as the conventional one. That is, the reading of the EEPROM is performed by making use of a phenomenon that the conductance of the channel forming region changes depending on the amount of electrical charge in the floating gate electrode. Further, the writing of the EEPROM is performed in such a manner that a high voltage of about 15V is applied on the drain region, which serves as the tunnel region at the same time, on the basis of the control gate electrode 8 so that a tunnel current flows through the tunnel insulating film which is as thin as about 100 Å. As the floating gate electrode 6 is entirely covered with an insulating film except when writing is performed, the electrical charge in the electrode is kept constant. That is, the electrode functions as a non-volatile memory.

Figure 3A:
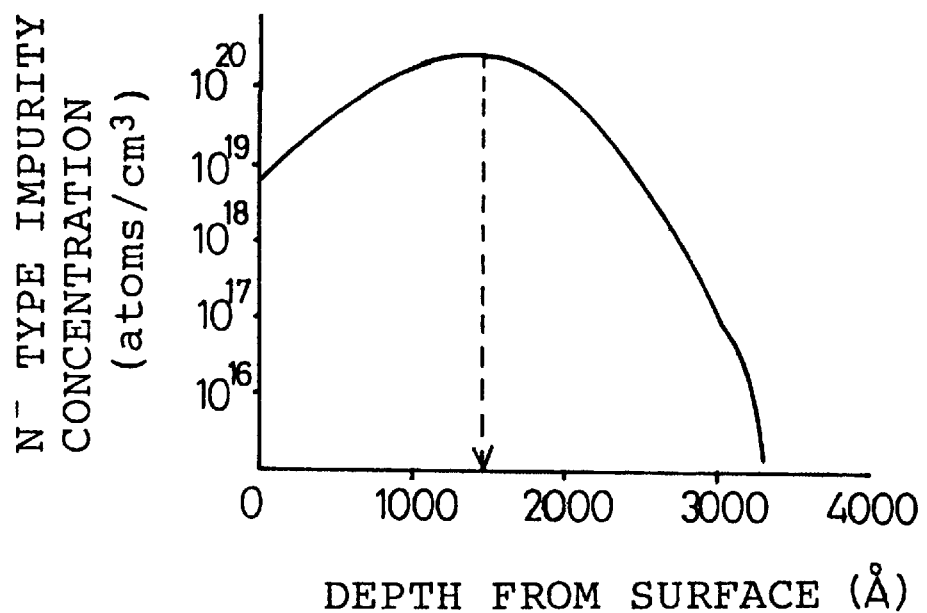
FIG. 3A is a graph showing an impurity concentration profile plotted against the direction of depth of a drain region.
Figure 3B:
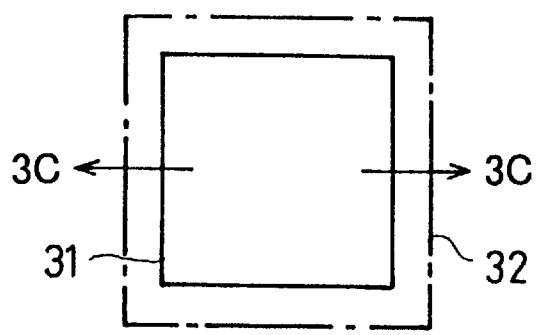
FIG. 3B is a plan view of the drain region with its impurity concentration profile.
Figure 3C:
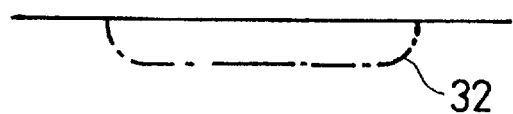
FIG. 3C is a sectional view taken along 3C—3C line of FIG. 3B illustrating the impurity concentration profile of the drain region.

FIG. 3A is a chart showing an impurity atom concentration profile from the surface of the drain region 3 of the tunnel region shown in FIGS. 1A to 1C. The peak position of the impurity atom concentration profile is set at a depth of about 1400 Å which is much higher 500 Å from the surface of the drain region 3. Accordingly, the surface impurity concentration of the drain region of the tunnel region takes a value smaller than $10^{20}$ atoms/cm$^{-3}$. Further, as the drain region is deeply doped by ion-implantation, in the region where the isolated region and the drain region 3 intersect, the surface impurity concentration becomes high as compared to the central portion of the drain region. In the intersecting region, the effective impurity concentration lowers due to the P-type impurity in the field dope region. However, by forming the drain region with N-type impurity by high accelerating energy ion-implantation, the impurity concentration around the drain region can be made high as compared to the central portion of the drain region. FIG. 3B is a plan view of the drain region and FIG. 3C is a sectional view taken along 3C—3C line of FIG. 3B. Where an ion-implantation is performed from a window 31 as shown in FIG. 3B, the peak impurity position lies around the window and deep from the surface of the drain region as at 32 in FIGS. 3B and 3C. Accordingly, the central portion of the drain region 3 is surrounded three-dimensionally by the high-concentration N-type impurity despite that the central portion of the drain region 3 has a low-level impurity concentration. Thus, by forming a drain region having its central portion three-dimensionally surrounded by high-concentration impurity (three directions including at least the channel forming region and the isolated region), even when a voltage of about 15V is applied on the drain region, almost no surface junction leak current flows therethrough.

This is because the portion surrounding the drain region has a high-concentration N-type impurity distribution so that even when a high voltage is impressed upon the region, no depletion thereof takes place. The potential of the tunnel region of the drain region is not depleted since the voltage of all the portion therearound is high so that a high voltage can be efficiently applied on the tunnel insulating film 5. Further, since the peripheral portion of the drain region 3 is covered with an insulating film which is more than several times thicker than the tunnel insulating film 5, it does not become depleted.

If the drain region is entirely concentrated as has hitherto been done, the depletion of the region can be prevented but it is difficult to form a high-quality tunnel insulating film on the concentrated drain region.

In addition, when the concentration of the drain region is entirely lowered in order to form a high-quality tunnel insulating film, the area adjoining the P-type region is depleted at the time of programming and as a result, a high voltage is no more impressed on the tunnel insulating film. In the present invention, a high-quality tunnel insulating film can be further formed in the drain region which is not depleted even when the tunnel region and the isolated region are provided adjacent to each other.

FIGS. 4A to 4H show sectional views of the EEPROM IC of the present invention with the views being given in the order of the manufacturing steps taken by the method of the present invention.

Figure 4A:
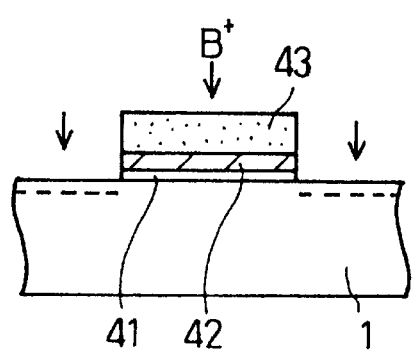
FIGS. 4A to 4H illustrate a series of steps to be taken for manufacturing the electric erasable semiconductor non-volatile memory cell of FIGS. 1A to 1C with each of manufacturing stages of the memory cell being shown in section.
Figure 4E:
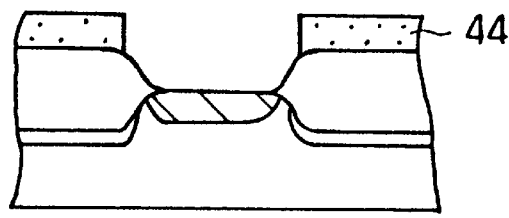
Figure 4B:
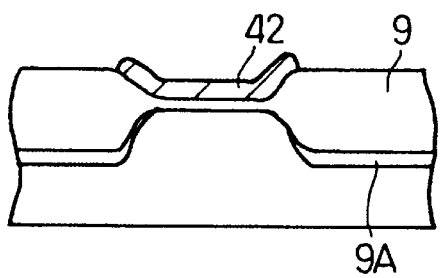
Figure 4F:
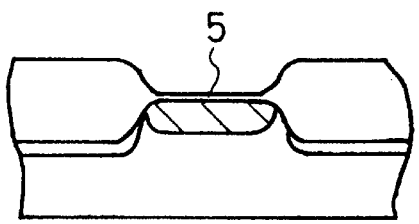
Figure 4C:
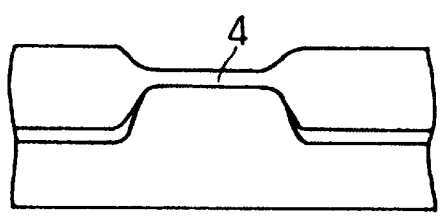

First, an oxide film 41 of about 500 Å and a nitride film 42 of about 1500 Å are patterned on the surface of a P-type silicon substrate by using a resist mask 43 (FIG. 4A). Then, ionized P-type impurity boron (B+) is implanted into the nitride film 42 by using a resist. After removing the resist, the surface is selectively oxidized by using the nitride film 42 as a mask thereby forming a field oxide film 9. At the time of this oxidization, a field dope region 9A is simultaneously formed. Next, as shown in FIG. 4C, a gate insulating film 4 is formed by gate oxidization after removing the nitride film 42 and the oxide film 41. Further, a drain region 3 is formed after patterning it by using a partial resist film according to the ordinary photolithographic process with the field insulating film 9 as a mask. The drain region 3 is ion-implanted with N-type impurity As ions with acceleration energy of higher than 120 keV. With these conditions, the peak position of impurity concentration is formed at a depth of more than 500 Å from the surface of the drain region 3. As the acceleration energy is high at the ends of the field insulating film, the peak position of the impurity concentration is formed on the substrate surface shallower than 500 Å.

Figure 4G:
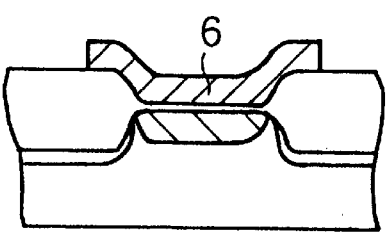
Figure 4D:
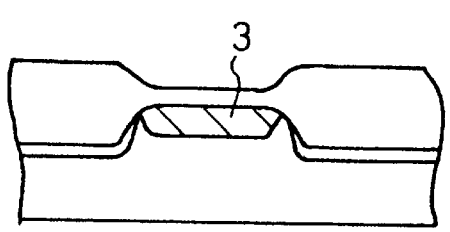
Figure 4H:
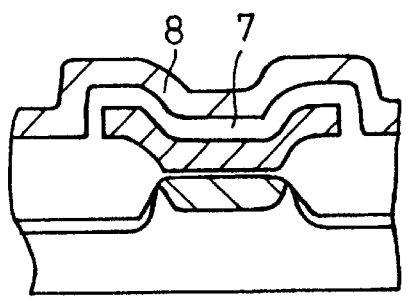

At either one of the ends of the field insulating film, the peak position of impurity concentration coincides with the interface between the silicon substrate surface and the field insulating film without fail. Accordingly, a high concentration drain region is formed in spite of the lowering of the effective N-type impurity concentration due to its overlapping with the field dope region 9A. Next, in order to form a tunnel region, a resist window 44 for forming a tunnel region is provided as shown in FIG. 4E and the gate insulating film 4 is removed by using the resist window 44 as a mask. Next, as shown in FIG. 4F, a tunnel insulating film 5 of about 10 Å is formed over the surface of the drain region 3 by thermal oxidation. After that, a polycrystal silicon film is formed as shown in FIG. 4G and a floating gate electrode 6 is patterned according to the ordinary photolithographic technology. Further, the entire surface is subjected to thermal oxidation to form a control insulating film 7 and then, a second layer polycrystal silicon film serving as a control gate electrode is formed so that the control gate electrode 8 is patterned according to the ordinary photolithographic technology as shown in FIG. 4H. Next, N+ type source and drain regions for establishing an ohmic contact with the electrode section (not shown) are formed in connection with N-type source and drain regions to thereby form an intermediate insulating film and then, contact holes are patterned in the intermediate insulating film. Further, a metal wiring is patterned and a passivation film is formed.

Figure 5A:
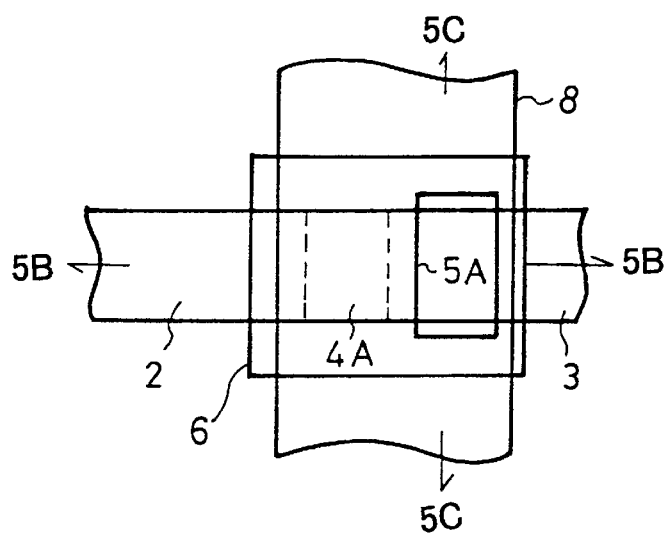
Figure 5C:
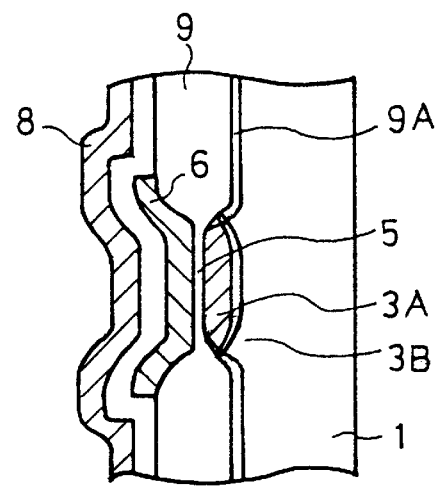
Figure 5B:
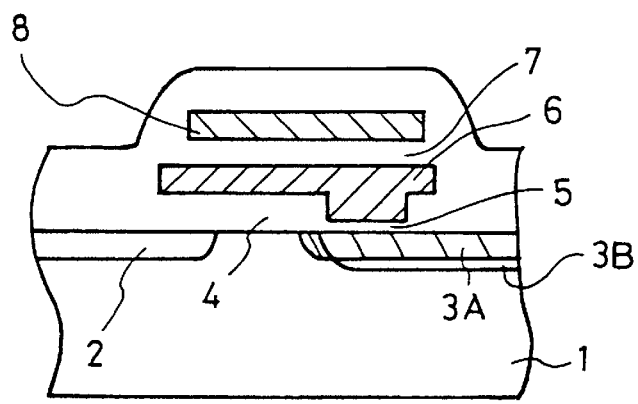

FIGS. 5A to 5C show a EEPROM cell according to another embodiment of the present invention. FIG. 5A is a plan view of the same, FIG. 5B is a sectional view taken along 5B—5B line of FIG. 5A and FIG. 5C is a sectional view taken along 5C—5C line of FIG. 5A.

On the surface of a P-type silicon substrate 1 there are formed a N-type source and drain regions 2, 3 in spaced-apart relationship with each other. On a channel forming region 4A which is a part of the surface of the silicon substrate between the source and drain regions there is provided a floating gate electrode 6 through a gate insulating film 4 and on the floating gate electrode 6 there is provided a control gate electrode 8 which is strongly capacity-coupled to the floating gate electrode through a control insulating film 7.

At a part of the portion between the drain region 3 and the floating gate electrode 8 there is formed a tunnel insulating film 5. A tunnel region, where the tunnel insulating film is provided, extends, as shown in FIG. 1A, to the portions where the drain region intersects an isolated region (comprising a field insulating film 9 and a field dope region 9A and electrically isolates memory cells from each other).

The method of reading/writing the EEPROM cell of FIGS. 5A to 5C is the same as that of FIGS. 1A to 1C.

The drain region 3 comprises a high-concentration drain region 3A and a low-concentration drain region 3B. As shown in FIG. 5C, the P-type field dope region 9A is formed under the field insulating film 9 in a self-alignment fashion. The drain regions 3A and 3B are formed in a self-alignment fashion since they are formed by ion-implantation using the field insulating film 9 as a mask. Accordingly, the concentration of the portion where the gate insulating film 5 and the field insulating film 9 are in contact with each other becomes effectively low. In the present invention, the low concentration drain region 3B is additionally provided to enlarge the portion of the drain region overlapping the field insulating film 9. For such enlargement of the overlapping portion, arsenic which is an impurity element of a small diffusion coefficient is used for the drain region 3A while phosphorus which is an impurity element of a large diffusion coefficient is used for the drain region 3B. The drain region 3B is provided so as to overlap the thick field insulating film 9. As the surface of the drain region 3B is formed of the thick field insulating film in spite of the concentration of that region being low, it does not become depleted. By enlarging the overlapping portion between the drain region 3B and the field insulating film 9, it may be apprehended that the isolation characteristic of the memory cell with respect to the adjoining memory cell is adversely affected. However, in the present invention, when a high voltage is applied on the drain region 3A, since the depletion layer extends inside the drain region 3B of low concentration, the isolation characteristic can be kept to the same level as the conventional device. In this case, despite the formation of the depletion layer inside the drain region 3B, since the surface of the drain region 3B is formed of the field insulating film 9, the depletion of the surface hardly progresses.

The shape of the drain region in the direction of the channel forming region 4A will be described. The tunnel region 5A is formed in contact with the isolated region 9 in the direction of width of the channel while it is in contact with the gate insulating film 4 in the longitudinal direction of the channel.

The tunnel insulating film 5 is a silicon dioxide film or nitride film of a thickness of 70–100 Å while the gate insulating film 4 has a thickness of 300–600 Å. Further, the channel forming region 4A is of P-type low impurity concentration of about $10^{16}$ atoms/cm. Accordingly, the drain regions 3A and 3B formed under the gate insulating film 4 are hardly depleted. Therefore, with respect to the longitudinal direction of the channel, the drain region 3B of low impurity concentration as shown in FIG. 5B may well be additionally formed inside the drain region 3A of high impurity concentration. In the embodiment in FIGS. 5A to 5C, the drain region 3B is formed in a self-alignment fashion with respect to the tunnel region 5A.

Figure 6:
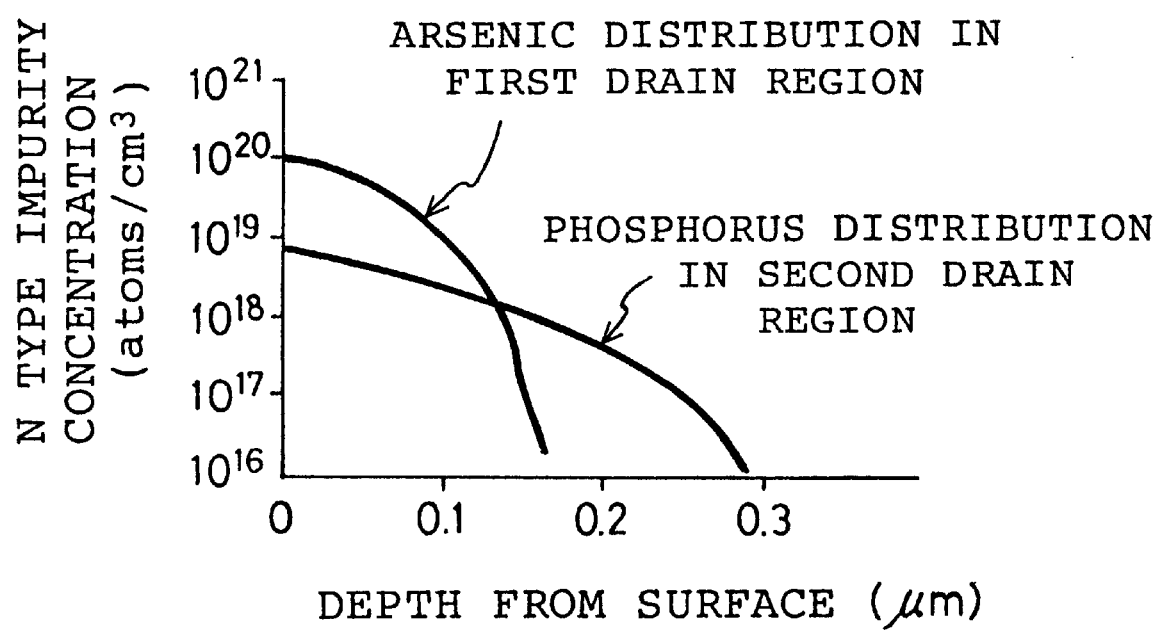
FIG. 6 is a graph showing an impurity concentration profile plotted against the direction of depth of the drain region of memory cell of FIGS. 5A to 5C from the surface thereof.

FIG. 6 is a chart showing an impurity atom concentration profile from the surface of the drain regions 3A and 3B formed under the tunnel region 5A shown in FIGS. 5A to 5C. The high impurity concentration drain region 3A is formed shallow while the low impurity concentration drain region 3B is formed deep.

FIGS. 7A to 7I illustrate a method of manufacturing the EEPROM cell of FIGS. 5A to 5C with each of the manufacturing stages of the cell being shown in section.

Figure 7E:
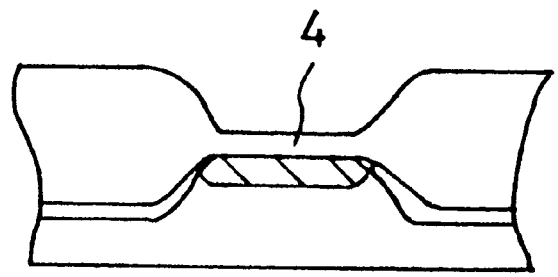
Figure 7F:
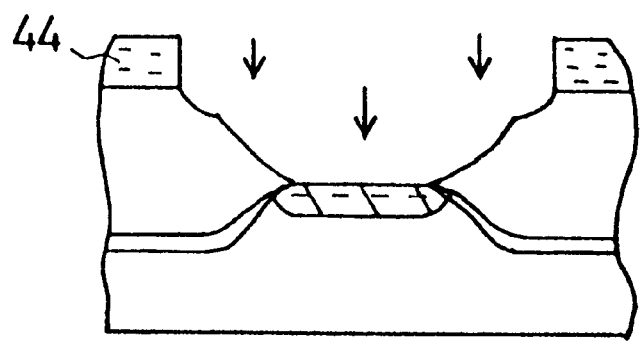
Figure 7G:
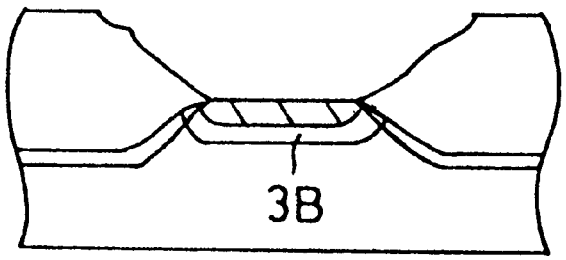
Figure 7H:
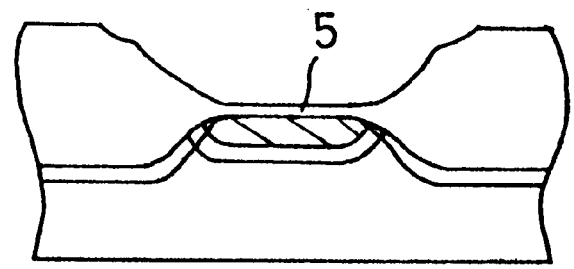
Figure 7I:
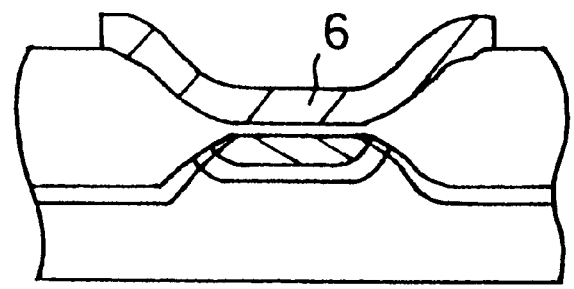

First, an oxide film 41 of about 500 Å and a silicon oxide film 42 of about 1500 Å are patterned on the surface of a P-type silicon substrate 1 by using a resist mask 43 as shown in FIG. 7A. Further, an ionized boron as a P-type impurity element is introduced into that surface by ion-implantation. Next, the surface is selectively oxidized using the silicon nitride film 42 as a mask to thereby form a field oxide film 9 as shown in FIG. 7B. Under the field oxide film 9 there is formed a field dope region 9A by the ionized boron doped by the ion-implantation. Next, an oxide film 4B is formed as shown in FIG. 7C and then, a high impurity concentration drain region 3A is formed as shown in FIG. 7D by introducing ionized arsenic using the field oxide film 9 as a mask. After that, a gate oxide film 4 is formed in the region other than the field insulating film 9 as shown in FIG. 7E and a resist film 44 is patterned by the ordinary photolithographic technology as shown in FIG. 7F. Further, the gate insulating film 4 in the transistor region inside the field insulating film 9 is removed by etching by using the resist film 44 as a mask. Before and after such etching, ionized phosphorus for forming a second drain region 3B according to the present invention is introduced by ion-implantation as shown in FIG. 7F. Then, a tunnel insulating film 5 of a thickness of about 70–100 Å is formed as shown in FIG. 7H and a polycrystal silicon film as a floating gate electrode 6 is patterned as shown in FIG. 7I. After the above steps, a control insulating film (not shown) is formed so that a control gate electrode is patterned thereon, and finally, an intermediate insulating film is formed so that an aluminum film serving as a wiring system is patterned thereon to thereby form a memory cell.

Figure 8A:
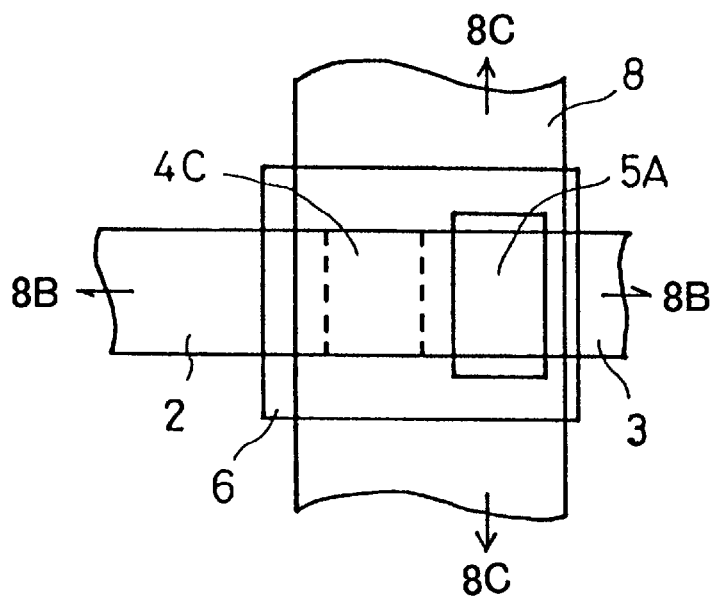
Figure 8C:
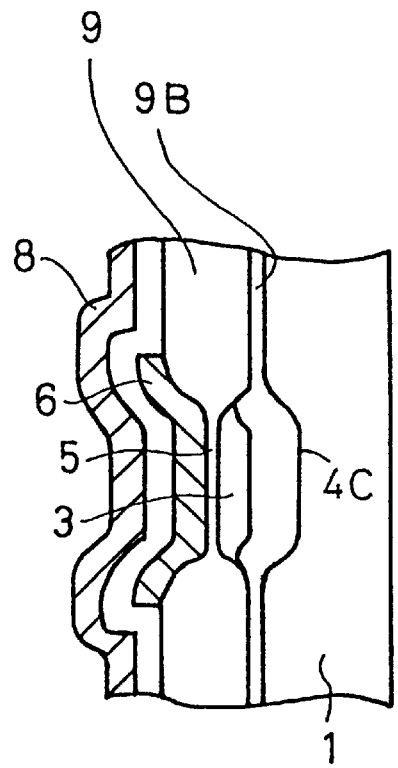
Figure 8B:
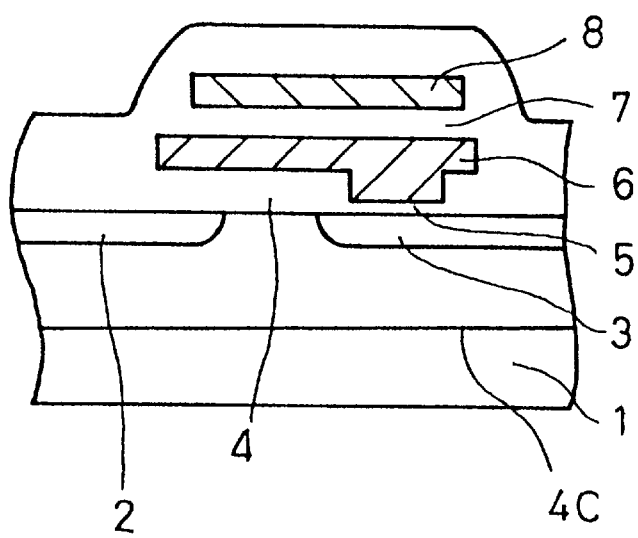

FIGS. 8A to 8C show an EEPROM cell according to another embodiment of the present invention, wherein FIG. 8A is a plan view, FIG. 8B is a sectional view taken along 8B—8B line of FIG. 8A and FIG. 8C is a sectional view taken along 8C—8C line of FIG. 8A.

On the surface of a P-type silicon substrate 1 there are formed a N-type source region 2 and a N-type drain region 3 in spaced apart relationship with each other. On a channel forming region 4C which is a part of the surface of the silicon substrate 1 between the source region and the drain region there is formed a floating gate electrode 6 through a gate insulating film 4 and on the floating gate electrode 6 there is provided a control gate electrode 8 which is strongly capacity-coupled to the floating gate electrode through a control insulating film 7.

At a part of the portion between the drain region 3 and the floating gate electrode 6 there is formed a tunnel insulating film 5. As shown in FIG. 8A, a tunnel region where the tunnel insulating film 5 is formed extends widely up to the portions where the drain region and an isolated region (which comprises a field insulating film 9 and a field dope region 9B and electrically isolate memory cells from each other) intersect each other.

The method of reading/writing of the EEPROM cell of FIGS. 8A to 8C is the same as that of FIGS. 1A to 1C.

Figure 9:
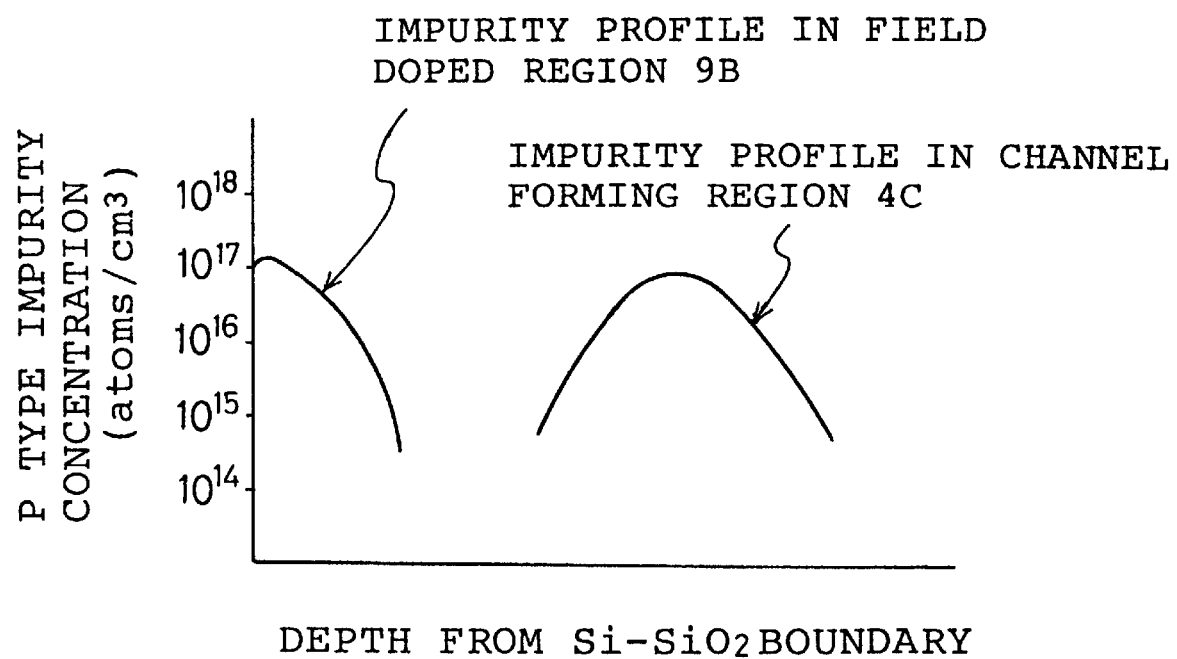
FIG. 9 is a P-type impurity concentration profile of the memory cell of FIGS. 8A to 8C plotted against the direction of depth of the isolation region and transistor region from the surfaces thereof.

FIG. 9 shows an inversion preventive P-type impurity element concentration profile at the central portion of the field isolated region and a P-type impurity element concentration profile in the channel forming region of the EEPROM cell of FIG. 8 in the direction of the depth from the surface of the silicon substrate. In the isolated region, the peak position of the impurity atom concentration lies on the surface of the silicon substrate so as to increase the inversion voltage. The inversion preventive P-type ions are implanted simultaneously in the isolated region and the channel forming region. That is, as will be described with respect to the manufacturing method of the EEPROM cell, the P-type ions are implanted into the silicon substrate through the field insulating film by using a high level of acceleration energy. Accordingly, the P-type impurity concentration profile in the channel forming region has its peak position at a considerable depth from the surface of the silicon substrate. Further, in the region where the thickness of the field insulating film 9 between the isolated region and the channel forming region continuously changes toward the tunnel insulating film 5 there takes place a continuous change from an impurity concentration profile in the field dope region 9B to an impurity concentration profile in the channel forming region 4C as shown in FIG. 9. Consequently, the impurity concentration of the substrate surface in the region extending from the isolated region up to the channel forming region and having a shape called a bird's beak rapidly reduces as compared to that of the central portion of the isolated region. Accordingly, the substantial lowering of the surface impurity concentration can be prevented by doping at the ends of the drain region 3 where impurity ions are introduced into the reverse conductive type channel forming region which is reversely formed in a self-alignment fashion with respect to the field insulating film 9. Thus, due to the lowering of the N-type impurity concentration at the ends of the drain region 3, when a positive programming high voltage is applied on the substrate 1 with respect to the drain region 3, it is possible to prevent the depletion of the surface of the drain region 3.

Further, in the case of the EEPROM cell of FIGS. 8A to 8C, the P-type impurity concentration of the isolated region can be made higher than that of the isolated region of the conventional device. The conventional device has had the disadvantage that if the impurity concentration of the field dope region 9A is made high, the pressure resistance against the drain region 3 lowers resulting in a failure of programming. In the embodiment of FIGS. 8A to 8C, the concentration of the field dope at the ends of the isolated region becomes lower than in the case of the conventional device so that even if the impurity concentration of the field dope region at the central portion of the isolated region, it is possible to obtain a sufficiently high degree of pressure resistance against the drain region. Further, since the field dope region 9B is formed after the formation of the field oxide film 9, the impurity absorption at the time of field oxidization as has hitherto been experienced does not take place and inversion voltage can be efficiently set to a high level also in the field dope region 9B of a low impurity concentration. Accordingly, in the case of the EEPROM cell of FIGS. 8A to 8C, not only the effect of reducing the size of the tunnel region by making that region lie adjacent to the isolated region can be obtained but also the width of the isolated region can be made smaller than in the case of the conventional device. Accordingly, the area of the memory cell per bit can be made small.

FIGS. 10A to 10H show a series of steps taken for manufacturing the EEPROM cell of FIGS. 8A to 8C with each of the manufacturing stages of the EEPROM cell being shown in section.

Figure 10A:
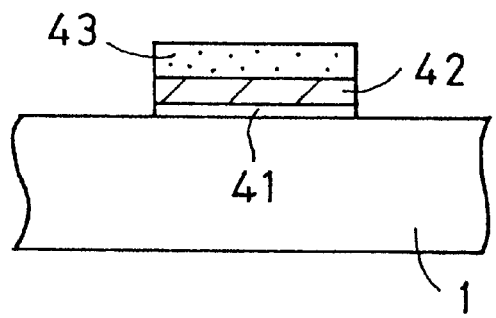

First, on the surface of a P-type silicon substrate 1 there are formed an oxide film 41 and a silicon nitride film 42 and then a resist pattern 43 is formed according to the ordinary photolithographic technology. After that, the silicon nitride film 42 is removed by etching as shown in FIG. 10A by using the resist pattern 43 as a mask.

Figure 10B:
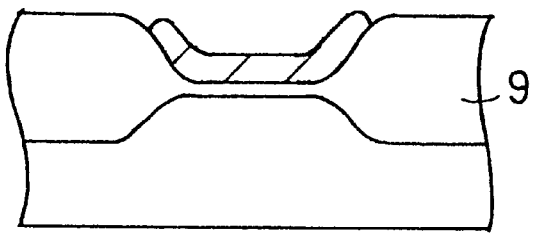

Next, the source of the silicon substrate 1 is selectively oxidized as shown in FIG. 10B by using the silicon nitride film 42 as a mask.

Figure 10C:
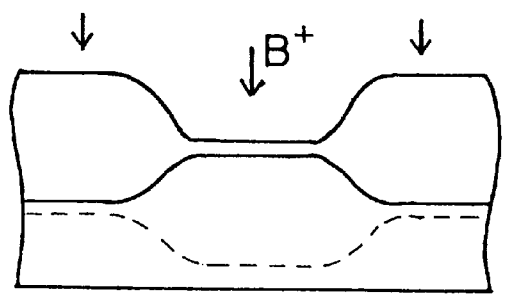

After the above steps, boron as a P-type impurity element is introduced into the entire surface of the P-type silicon substrate by ion-implantation with a high acceleration voltage as shown in FIG. 10C. Where the thickness of the field oxide film 9 is 700 A, the implantation of ionized boron is performed with an acceleration voltage of higher than 280keV so that the peak position of impurity boron concentration comes to lie inside the silicon substrate 1. In the channel forming region 4c, ionized boron is implanted deep as shown in FIG. 10C. Further, in the bird's beak region formed at the time of selective oxidation of the surface of the substrate, the peak position of boron impurity concentration shifts little by little toward the interior of the substrate. That is, on the surface of the substrate, the concentration of the boron element in the bird's beak region is low as compared to the region where the field insulating film 9 is sufficiently thick. Next, where necessary, the P-type impurity concentration profile is enlarged due to diffusion by thermally treating the substrate.

Figure 10D:
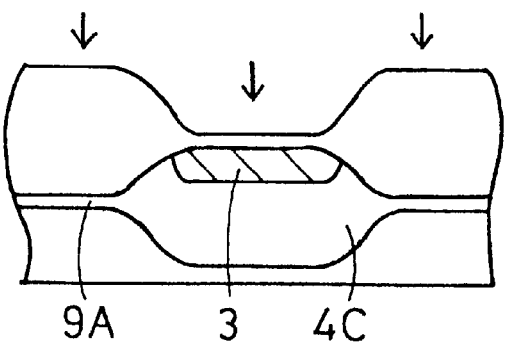

Next, as shown in FIG. 10D, a drain region 3 is formed by the implantation of ionized arsenic as a N-type impurity element.

Figure 10E:
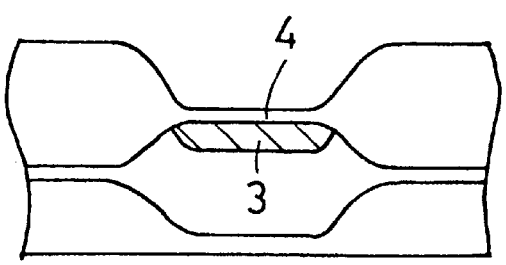

A gate insulating film 4 is formed as shown in FIG. 10E such that after the formation of the drain region 3, the oxide film on the transistor region of the silicon substrate is removed and then the substrate is thermally oxidized. Then, as shown in FIG. 10F, a resist pattern 44 for forming a tunnel region is formed according to the ordinary photolithographic technology and the gate insulating film 4 is removed by etching by using the resist pattern 44 as a mask. After that, an oxide film of a thickness of 300–600 Å is formed so as to increase the pressure resistance of the drain region 3. After the above steps, the tunnel region is windowed as shown in FIG. 10F and a thin tunnel insulating film 5 of 70–100 Å is formed by thermal oxidation or thermal nitrification to produce a chip shown in FIG. 10G.

Next, a floating gate electrode 6 is patterned over the gate insulating film 4 and the tunnel insulating film 5 according to the ordinary photolithographic technology as shown in FIG. 10H and generally, a control gate electrode is patterned after the formation of a control insulating film. Next, an intermediate insulating film is formed, contact holes are drilled for providing a wiring system and then a passivation film is formed to thereby complete the manufacture of the EEPROM cell.

In the embodiment of FIGS. 10A to 10H, the field insulating film is formed by selective oxidization but it may be formed by another method. For example, a thick oxide film of a thickness of about 7000 Å is formed on the silicon substrate and then the oxide film on the transistor region is removed by etching according to the ordinary photolithographic technology. After that, a field doping by ion-implantation is performed to obtain a chip similar to that shown in FIG. 10C.

In the embodiment of FIGS. 10A to 10H, the impurity concentration of field doping at the interface between the field insulating film and the substrate can be made higher than in the case of the conventional device. Accordingly, even when the thickness of the field insulating film is made smaller from 4000 Å down to about 7500 Å, it is still possible to obtain the same isolation characteristic (of a level at which almost no intermemory leakage current flows even when a program voltage of higher than 15V is applied on the wiring on the field insulating film and the tunnel diffusion region of the memory) as the conventional device.

It should be noted that although a plurality of embodiments of the EEPROM cell of the present invention have been described in the foregoing, a still greater effect can be derived from a combination of these embodiments although not illustrated in the drawings. That is, in the FIGS. 8A to 8C embodiment, a more effective EEPROM cell can be formed by forming the drain region 3 from the drain regions 3A and 3B of FIGS. 5A to 5C. Further, in FIGS. 5A to 5C, the EEPROM cell can have a still greater effect by allowing the high impurity concentration drain region 3 to have the impurity concentration profile shown in FIGS. 3A to 3C. Further, in the EEPROM cell of FIGS. 8A to 8C, a still greater effect can be obtained by allowing the drain region 3A to have the impurity concentration profile shown in FIGS. 3A to 3C.

As described above, the present invention has the advantage that by setting the surface impurity concentration of the N-type region of the tunnel region to a low level and by forming a high impurity concentration profile region surrounding the N-type region, the depletion of the tunnel region can be prevented and the tunnel insulating film on the tunnel region can be of high quality.

Moreover, by allowing the drain region to have a double-diffusion structure as described above, it becomes possible with a small-sized memory cell to allow a program voltage to be efficiently applied on the tunnel oxide film thereby providing an inexpensive and high-quality EEPROM cell.

Moreover, since the field dope region of the isolated region is formed after the formation of the field insulating film, the tunnel region and the isolated region come to lie adjacent to each other so that the depletion of the drain region can be prevented.

Still further, according to the present invention, the pressure resistance at the junction of the drain region and field dope region can be made high so that the impurity concentration of the field dope region can be set to a high level and the width of the isolated region can be made small.

What is claimed is:

1. A method of manufacturing an electrically erasable semiconductor non-volatile memory device, comprising the steps of: forming a field insulating film on a surface of a semiconductor substrate having a first conductivity type; forming a gate insulating film on the surface of the semiconductor substrate; forming source and drain regions having a second conductivity type in the surface of the semiconductor substrate in spaced-apart relationship with each other by introducing impurity ions having the second conductivity type into the semiconductor substrate with an acceleration energy sufficient to form a peak value of impurity concentration at least at the drain region at a depth of more than approximately 500 Å from the surface of the semiconductor substrate; etching the gate insulating film on the drain region to form a tunnel region having opposite sides connected to the field insulating film; forming a tunnel insulating film on the tunnel region; forming a floating gate electrode over the source region, the drain region and the semiconductor substrate through the gate insulating film and the tunnel insulating film; forming a control insulating film on the floating gate electrode; and forming a control gate electrode over the floating gate electrode through the control insulating film.

2. A method of manufacturing an electrically erasable semiconductor non-volatile memory device, comprising the steps of: forming a field insulating film on a surface of a semiconductor substrate having a first conductivity type; introducing an impurity element having the first conductivity type into the surface of the semiconductor substrate through the field insulating film by ion-implantation to form a field dope layer directly under the field insulating film and to form an impurity region having the first conductivity type at an open area of the field insulating film at a depth greater than that of the field insulating film; forming source and drain regions having a second conductivity type in spaced-apart relationship with each other in the semiconductor substrate where the field insulating film is not formed to define a transistor region; forming a gate insulating film on a surface of the transistor region; etching a part of the gate insulating film on the drain region to form a tunnel region having opposite sides connected to the field insulating film; forming a tunnel insulating film on a surface of the tunnel region; and forming a floating gate electrode over the source region, the drain region and the tunnel region through the gate insulating film and the tunnel insulating film.

3. A method of manufacturing an electrically erasable semiconductor non-volatile memory device as claimed in claim 1; wherein the step of forming the drain region includes introducing the impurity ions with an acceleration energy greater than 120 Kev.

4. A method of manufacturing an electrically erasable semiconductor non-volatile memory device, comprising the steps of: forming a field insulating film on a surface of a semiconductor substrate having a first conductivity type; forming a gate insulating film on the surface of the semiconductor substrate; forming spaced-apart source and drain regions having a second conductivity type in the surface of the semiconductor substrate; forming a tunnel insulating film over the drain region and having opposite sides connected to the field insulating film; forming a floating gate electrode over the tunnel insulating film and the drain region; forming a control insulating film on the floating gate electrode; and forming a control gate electrode over the floating gate electrode.

5. A method of manufacturing an electrically erasable semiconductor non-volatile memory device as claimed in claim 4; wherein the step of forming the drain region includes introducing impurity ions having the second conductivity type into the semiconductor substrate with an acceleration energy sufficient to form a peak value of impurity concentration at a depth greater than 500 Å from the surface of the semiconductor substrate.

6. A method of manufacturing an electrically erasable semiconductor non-volatile memory device as claimed in claim 5; wherein the step of forming the drain region includes introducing the impurity ions with an acceleration energy greater than 120 Kev.

7. A method of manufacturing an electrically erasable semiconductor non-volatile memory device as claimed in claim 4; wherein the opposite sides of the tunnel insulating film are directly connected to the field insulating film.

8. A method of manufacturing an electrically erasable semiconductor non-volatile memory device, comprising the steps of: forming a field insulating film on a surface of a semiconductor substrate having a first conductivity type; introducing an impurity element having the first conductivity type into the surface of the semiconductor substrate; forming spaced-apart source and drain regions having a second conductivity type in the semiconductor substrate at a region where the field insulating film is not formed to define a transistor region; forming a gate insulating film on a surface of the transistor region; forming a tunnel insulating film over the drain region and having opposite sides connected to the field insulating film; and forming a floating gate electrode over the drain region and the tunnel insulating film.

9. A method of manufacturing an electrically erasable semiconductor non-volatile memory device as claimed in claim 8; wherein the introducing step comprises introducing the impurity element into the surface of the semiconductor substrate to form a field dope layer directly under the field insulating film and to form an impurity region having the first conductivity type at a depth greater than that of the field insulating film.

10. A method of manufacturing an electrically erasable semiconductor non-volatile memory device as claimed in claim 8; wherein the opposite sides of the tunnel insulating film are directly connected to the field insulating film.

* * * * *